(12) United States Patent
Jones et al.

(10) Patent No.: US 7,303,140 B2
(45) Date of Patent: Dec. 4, 2007

(54) OPERATIONALLY INTERACTIVE ENCLOSURE

(75) Inventors: Allen M. Jones, Kensington, MD (US); Nicholas J. Nagurny, Manassas, VA (US); Ryan C. Brewer, Bristow, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 612 days.

(21) Appl. No.: 10/837,270

(22) Filed: May 3, 2004

(65) Prior Publication Data

US 2005/0242202 A1 Nov. 3, 2005

(51) Int. Cl.
*F24F 7/00* (2006.01)
*H05K 7/20* (2006.01)
(52) U.S. Cl. ............... 236/49.3; 62/259.2; 361/695
(58) Field of Classification Search ........... 236/49.3, 236/DIG. 3; 62/259.2; 361/695, 696, 688, 361/687
See application file for complete search history.

(56) References Cited

U.S. PATENT DOCUMENTS

| 5,410,607 | A | | 4/1995 | Mason et al. |
|---|---|---|---|---|
| 5,704,596 | A | | 1/1998 | Smith et al. |
| 5,788,029 | A | | 8/1998 | Smith et al. |
| 5,808,903 | A | * | 9/1998 | Schiltz et al. ............ 702/56 |
| 6,134,108 | A | * | 10/2000 | Patel et al. ............ 361/695 |
| 6,276,900 | B1 | | 8/2001 | Lyszkowski et al. |
| 6,398,505 | B1 | * | 6/2002 | Sekiguchi ............ 417/2 |
| 6,469,639 | B2 | | 10/2002 | Tanenhaus et al. |
| 2002/0065426 | A1 | * | 5/2002 | Ikeno et al. ............ 556/96 |
| 2002/0079375 | A1 | * | 6/2002 | Bulthuis ............ 236/49.3 |
| 2002/0079746 | A1 | * | 6/2002 | Hashimoto ............ 307/149 |
| 2003/0112600 | A1 | * | 6/2003 | Olarig et al. ............ 361/687 |

* cited by examiner

*Primary Examiner*—Chen Wen Jiang
(74) *Attorney, Agent, or Firm*—Mark A. Wurm

(57) ABSTRACT

A platform for electronic components has a temperature sensing array, a vibration sensing array, a programmable logic device, and one or more cooling fans. The programmable logic device receives temperature data from the temperature sensing array and structure-borne noise data from the vibration sensing array. The programmable logic device analyzes the data, and based on this analysis, maintains the temperature and low level noise requirements of the system by activating, deactivating, speeding up, or slowing down one or more cooling fans.

22 Claims, 1 Drawing Sheet

OPERATIONALLY INTERACTIVE ENCLOSURE

FIELD OF THE INVENTION

The present invention relates to temperature control and low level noise control in electronic component enclosures and other platforms.

BACKGROUND OF THE INVENTION

Virtually all commercial and military industries are dependent on integrated processors, computing, and the electronic components associated therewith to carry out their businesses and missions. It is well known that these electronic components, when they are energized and consuming power, produce heat that in most instances must be actively removed by means other than simple radiation-dissipation to the surrounding environment. To accomplish this heat removal, many industrial and military applications use fans and/or blowers to convectively remove the heat produced by energy consuming electronic components.

To be most effective, these fans are normally mounted onto the chassis, housing, enclosure or platform that contains the electronic components. Mounting the fans in this manner however can create low level noise problems, since the vibration or structure-borne noise generated by the operating fans may be transmitted to the electronic components, the platform for the electronic components, and the surrounding environment.

In some applications, such as military submarine platforms in which stealth is required, it is critical to limit low level noise. Indeed, military standards such as MIL-STD 740-2 detail the measurement and limits of structure-borne low level vibratory noise. One way to limit such noise is to slow down the speed of the fans used to cool the electronic components, or to deactivate one or more of those fans.

The cooling of electronic components and the reduction of low level structure-borne noise are, on most if not all platforms, competing critical parameters. They are critical because an elevated temperature within an electronic enclosure may lead to failure of electronic components, and elevated structure-borne noise may lead to a military vehicle such as a submarine becoming detectable by hostile forces. They are competing because to attain or maintain a lower temperature, more fans must be run at greater speeds. However, operating more fans at greater speeds will increase the low level noise associated with the enclosure. Despite the dynamics and interrelatedness between temperature control and noise control, prior art systems are single point solutions—i.e. they address either temperature or noise independently, but not the effect of one on the other. Consequently, the art is in need of a system that can simultaneously and logically control both convective cooling and low level noise reduction so that the two competing interests can be simultaneously addressed.

SUMMARY OF THE INVENTION

The present invention addresses computing resource allocation and conflicting environmental needs. In one embodiment, a platform or enclosure has on or within it electronic components. The platform or enclosure further contains arrays of heat sensing and vibration sensing devices, both of which are electrically connected to a programmable logic device through an analog to digital converter. The programmable logic device is in turn coupled to one or more cooling fans or blowers. The thermal sensing devices, vibration sensing devices, and fans can be positioned in any manner on or about the platform or enclosure.

In operation, the thermal sensing devices detect the heat generated by the electronic components, and activate or deactivate, and/or speed up or slow down, the necessary fan or fans. Similarly, and in conjunction with the temperature sensing devices, the vibration sensing devices monitor the low level noise in the system, much of which is generated by the cooling fans. The programmable logic device contemporaneously and simultaneously analyzes the data from both the thermal sensing devices and the vibration sensing devices, and determines what action needs to be taken to keep the system within the temperature and noise level requirements. Such actions include activating, deactivating, speeding up, and/or slowing down one or more fans.

It is therefore an object of a preferred embodiment of the present invention to use both temperature data and vibration data to maintain a system of electronic components within temperature and noise level specifications.

DETAILED DESCRIPTION OF THE INVENTION, INCLUDING THE BEST MODE

Figure 1:
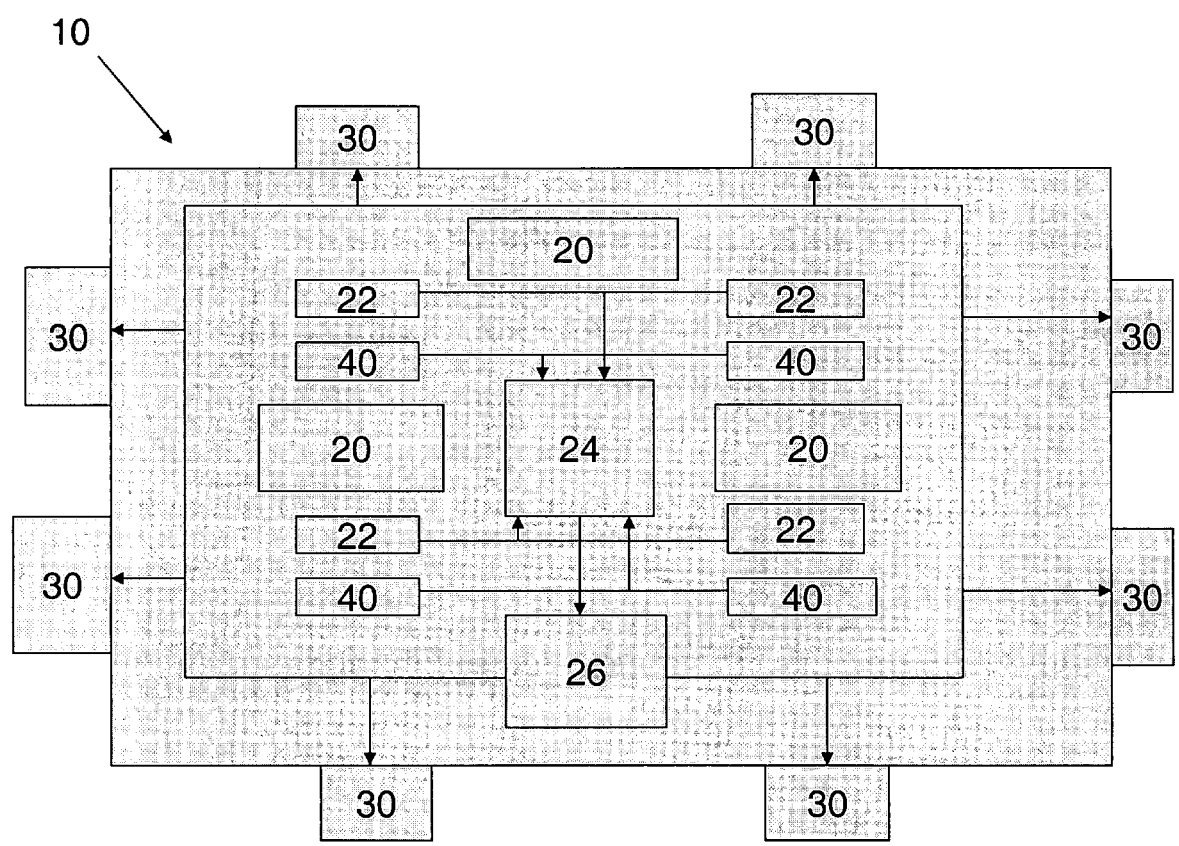
FIG. 1 is a block diagram of the components of one embodiment of the present invention.

FIG. 1 is a block diagram of one embodiment of the present invention, which is an operationally interactive enclosure 10 that contains electronic components 20. The electronic components 20 may include integrated circuits, circuit boards, power supplies, fiber optic switches and other devices or components. While the enclosure 10 will be described herein as an enclosure for electronic components, it need not be so limited, and could be some other platform besides a complete enclosure, and it could support or house any components or materials that have cooling and noise reduction requirements.

A thermal sensing array is positioned in the enclosure 10. The thermal array consists of a plurality of sensing devices 22, such as thermistors, dispersed throughout the enclosure 10. In addition to thermistors being placed throughout the enclosure to register the ambient temperature of the enclosure 10, thermal data could also be acquired from sources such as power supplies, heat sinks of integrated circuits, or exhaust air from the enclosure. In the case of heat sinks and power supplies, a proper interface would be required. The sensing devices 22 can be positioned throughout the enclosure in virtually any arrangement and concentration. For example, the devices 22 could be spaced equidistantly throughout the enclosure 10 so that a temperature profile of the entire enclosure is obtained. Alternatively, sensing devices 22 could be concentrated in a critical area of the enclosure. An area could be designated as critical because of the concentration of heat producing components localized there, the presence of a particularly critical piece of hardware, or some other reason.

The sensing devices 22 are connected to an analog to digital converter 24. The A/D converter 24 converts the analog output of the sensing devices 22 into digital format, and is connected to programmable logic device 26 (PLD). The PLD 26 is in turn connected to a plurality of fans 30.

Like the sensing devices 22, there can be any number of fans 30, and these fans can be placed in proximity to the enclosure 10 in an equidistant arrangement, or placed in proximity to the enclosure 10 based on the cooling requirements of a particular area of the enclosure. Once again, the cooling requirements of a particular portion of the enclosure could be dictated by the number of components in that area, the criticality of a component or components in that area, or some other factor or factors.

The enclosure 10 further contains a plurality or network of transducers 40, such as accelerometers, that make up a vibration sensing array and measure the structure-borne or low level noise within the enclosure 10. The transducers 40 are connected to the A/D converter 24, which in turn is connected to PLD 26, and which in turn is connected to the fans 30.

The operationally interactive enclosure 10 operates as follows. As detailed supra, temperature sensing devices 22 are placed within the enclosure 10 in virtually any arrangement desired. That is, if it is important that the temperature in all areas of the enclosure be known, the sensing devices 22 may be positioned equidistantly throughout the enclosure. If there are critical areas within the enclosure, sensing devices may be concentrated in that area. Alternatively, physically equidistant sensing devices could be logically controlled by the PLD 26 to concentrate on a certain area of the enclosure, irrespective of the physical arrangement of sensing devices 22. The devices produce an analog output proportional to the temperature in the area of the devices, and this output is converted to digital format by A/D converter 24 for processing by the PLD 26.

The logic and data programmed into the PLD 26 determine whether the temperature requirements of the system are being met. If the sensing devices 22 are spread equidistantly throughout the enclosure 10, at least two logic schemes could be implemented. In one embodiment, the temperature readings for all sensors could be averaged, giving an average temperature within the enclosure, and the cooling fans 30 turned on, turned off, sped up or slowed down depending on those readings. In another embodiment, if the temperature control in one area of the enclosure is more critical than in other areas of the enclosure, the sensing devices of that area could be logically isolated from the other areas' sensing devices. This logical isolation would allow the independent control of the fans in that critical area. With such a set up, there would be no need to run fans in non-critical areas of the enclosure, and the fans in the critical area could be run at a higher speed to increase the rate of heat removal. It is preferred that the placement of the sensing devices 22 be capable of modification by the logic of the PLD 26 rather than require a physical alteration, since a logical change is much easier to implement than a physical change.

In a similar fashion, instead of being placed equidistant throughout the enclosure, sensing devices 22 may be physically concentrated in a critical area of the enclosure 20. Similarly, the fans 30 may be placed equidistantly around the enclosure, or concentrated in a particular critical area of the enclosure. The PLD 26 could then use the data from these specifically placed sensing devices to control all the fans, fans only in that area, or any combination of the fans.

While the sensing devices 22, PLD 26 and fans 30 are monitoring and controlling the temperature of the enclosure, the transducers 40 are monitoring the low level or structure-borne noise associated with the enclosure. The transducers sense vibration and produce an analog signal. The analog signal is converted to a digital signal by the A/D converter 24, the digital signal is sent to the PLD 26 and analyzed, and a decision is made by the PLD 26 as to what course of action to take based on that data. If the PID 26 determines that the structure-borne noise of the system is excessive, corrective action must be taken. One effective manner of reducing that noise is by turning off one or more fans, and/or reducing the speed of one or more fans. However, as outlined supra, while decreasing the number of fans running and/or the speed of those fans will reduce the noise level, this will also increase the heat level of the enclosure by decreasing the amount and rate of heat removal.

It is at this point that the logic programmed into the PLD 26 weighs the competing goals of temperature maintenance and noise reduction. Decisions are programmed into the PLD as to the proper course of action to take in light of the present state of the system as indicated by the data. These decisions are based on predeterminations as to the highest noise level that can be tolerated and the highest temperature that the electronic components of the enclosure can withstand. For example, the fan speed could be increased when the low level noise level is not critical (e.g. in non-hostile territories), thereby cooling the electronic components to a level below that of the specifications. Then, when the maintenance of a low level of noise is critical, the speed and/or number of fans can be cut back without as much adverse effect since the components have previously been cooled to below specifications.

Moreover, the very design of the system allows for the concurrent addressing of temperature and noise concerns. That is, by permitting the isolation of the critical areas of the enclosure, and in particular the logical isolation of the critical areas of the enclosure, fans in that area may be operated to continue cooling, or even operated at higher speeds, while fans in a non-critical area can be slowed down or turned off to cut down on the low level noise. Consequently, the system allows increased cooling of critical areas of the enclosure 10 without adding to, and perhaps decreasing, the structure-borne noise level of the system. The exact operating conditions, that is the number of fans operating and the speed of the fans, will vary in each particular application, and may be programmed into the PLD 26.

While the invention has been described in its preferred and other embodiments, it is to be understood that the words used are words of description rather than limitation and that changes may be made within the purview of the appended claims without departing from the true scope and spirit of the invention in its broader aspects. For example, while the technique for simultaneously monitoring and controlling temperature and structure-borne noise has primarily been discussed in connection with enclosures containing electronic components, the present invention could be applied to many other situations and environments that involve enclosures or other platforms, the controlling of temperature, and the controlling of structure-borne low level noise.

The invention claimed is:

1. An operationally interactive enclosure comprising:
   a housing;
   one or more thermal sensing devices;
   one or more transducers;
   a programmable logic device; and
   one or more fans;
   wherein said programmable logic device determines when structure borne noise is greater than a threshold, and further wherein said programmable logic device causes either a turning off of one or more of said fans or a reduction in speed of one or more of said fans when said structure borne noise exceeds said threshold.

2. The operationally interactive enclosure according to claim 1, further comprising an analog to digital converter; and wherein said data from said one or more thermal sensing devices comprises a temperature;

and further wherein said programmable logic device determines, based on said temperature data and said structure borne noise, the operating conditions of said fans.

3. The operationally interactive enclosure according to claim 2, wherein the programmable logic device alters the operating speed of a number of fans that is less than the total number of fans mounted on said enclosure.

4. The operationally interactive enclosure according to claim 2, wherein said programmable logic device alters the number of fans that are operating in response to said data from said one or more transducers.

5. The operationally interactive enclosure according to claim 1, wherein said enclosure houses electronic components.

6. The operationally interactive enclosure according to claim 1, wherein said one or more thermal sensing devices comprises thermal sensing arrays.

7. The operationally interactive enclosure according to claim 6, wherein said thermal sensing arrays comprise thermistors.

8. The operationally interactive enclosure according to claim 1, wherein said one or more transducers comprises a vibration sensing array.

9. The operationally interactive enclosure according to claim 1, wherein said one or more thermal sensing devices is positioned equidistantly throughout said enclosure.

10. The operationally interactive enclosure according to claim 1, wherein said thermal sensing devices are logically positioned throughout said enclosure.

11. An operationally interactive platform comprising:
one or more thermal sensing devices;
one or more transducers;
a programmable logic device; and
one or more fans;
wherein said programmable logic device determines when structure borne noise is greater than a threshold, and further wherein said programmable logic device causes either a turning off of one or more of said fans or a reduction in speed of one or more of said fans when said structure borne noise exceeds said threshold.

12. The operationally interactive platform according to claim 11, further comprising a housing and an analog to digital converter.

13. The operationally interactive platform according to claim 11, wherein said platform further comprises electronic components.

14. A method to control the temperature and structure-borne noise on an electronic component platform, comprising the steps of:

collecting temperature data;
collecting structure-borne noise data;
processing said temperature data and said structure-borne noise data; and
causing either a turning off of one or more fans or a reduction in speed of one or more fans when said structure borne noise exceeds a threshold.

15. The method to control the temperature and structure-borne noise on an electronic component platform according to claim 14,
wherein said temperature data is collected with a thermal sensing array;
and wherein said structure-borne noise data is collected with a vibration sensing array;
and further wherein said temperature data and said structure-borne noise data is processed within a processing unit.

16. The method to control the temperature and structure-borne noise on an electronic component platform according to claim 14, wherein the speed of one or more fans is modified based on said temperature data and said structure-borne noise data.

17. The method to control the temperature and structure-borne noise on an electronic component platform according to claim 14, wherein one or more fans are deactivated based on said temperature data and said structure-borne noise data.

18. The method to control the temperature and structure-borne noise on an electronic component platform according to claim 14, wherein one or more fans are activated based on said temperature data and said structure-borne noise data.

19. The method to control the temperature and structure-borne noise on an electronic component platform according to claim 14, wherein the number of fans operating depends on the criticality of the temperature requirements of a particular section of said platform.

20. The method to control the temperature and structure-borne noise on an electronic component platform according to claim 14, wherein the operating speed of said fans depends on the criticality of the temperature requirements of a particular section of said platform.

21. The method to control the temperature and structure-borne noise on an electronic component platform according to claim 14, wherein the number of fans operating depends on the criticality of the noise requirements of a particular section of said platform.

22. The method to control the temperature and structure-borne noise on an electronic component platform according to claim 14, wherein the operating speed of said fans depends on the criticality of the noise requirements of a particular section of said platform.

* * * * *